United States Patent
Xu et al.

(10) Patent No.: US 12,310,188 B2
(45) Date of Patent: May 20, 2025

(54) DISPLAY PANEL AND DISPLAY DEVICE

(71) Applicant: SOUTH CHINA UNIVERSITY OF TECHNOLOGY, Guangdong (CN)

(72) Inventors: Miao Xu, Guangdong (CN); Lei Zhou, Guangdong (CN); Hong Tao, Guangdong (CN); Min Li, Guangdong (CN); Hongmeng Li, Guangdong (CN); Hua Xu, Guangdong (CN); Zikai Chen, Guangdong (CN); Jianhua Zou, Guangdong (CN); Lei Wang, Guangdong (CN); Junbiao Peng, Guangdong (CN)

(73) Assignee: SOUTH CHINA UNIVERSITY OF TECHNOLOGY, Guangdong (CN)

( * ) Notice: Subject to any disclaimer, the term of this patent is extended or adjusted under 35 U.S.C. 154(b) by 501 days.

(21) Appl. No.: 17/799,519

(22) PCT Filed: Feb. 8, 2021

(86) PCT No.: PCT/CN2021/076023
§ 371 (c)(1),
(2) Date: Aug. 12, 2022

(87) PCT Pub. No.: WO2021/160090
PCT Pub. Date: Aug. 19, 2021

(65) Prior Publication Data
US 2023/0075372 A1     Mar. 9, 2023

(30) Foreign Application Priority Data
Feb. 14, 2020  (CN) .......................... 202010092736.1

(51) Int. Cl.
*H10K 59/131*   (2023.01)
*H10K 59/128*   (2023.01)
(Continued)

(52) U.S. Cl.
CPC .......... *H10K 59/128* (2023.02); *H10K 59/131* (2023.02); *H10K 77/111* (2023.02); *H10K 2102/311* (2023.02)

(58) Field of Classification Search
CPC ........................... H10K 59/131; H10K 59/128
See application file for complete search history.

(56) References Cited

U.S. PATENT DOCUMENTS

| | | | |
|---|---|---|---|
| 2007/0001927 A1* | 1/2007 | Ricks .................... | G09F 9/3026 345/1.1 |
| 2011/0057861 A1* | 3/2011 | Cok ........................ | H10K 59/18 345/1.3 |

(Continued)

FOREIGN PATENT DOCUMENTS

| CN | 201589919 U | 9/2010 |
|---|---|---|
| CN | 106409149 A | 2/2017 |

(Continued)

OTHER PUBLICATIONS

International Search Report mailed Mar. 30, 2021, for related Application No. PCT/CN2021/076023 (6 pgs).

(Continued)

*Primary Examiner* — Douglas M Menz
(74) *Attorney, Agent, or Firm* — ArentFox Schiff LLP; Joseph M. Maraia; Marlo Schepper Grolnic

(57) ABSTRACT

Provided are a display panel and a display device. The display panel includes at least two display units. Each display unit includes a substrate, a flexible substrate, a light-emitting unit circuit layer and at least one driver chip. The rigid substrate includes a display bearing region and a splicing region located on at least one side of the display bearing region. The flexible substrate is located on a first surface of the rigid substrate and located in the display bearing region, and the flexible substrate at least partially extends out of the display bearing region of the rigid (Continued)

substrate. The light-emitting unit circuit layer is located on a surface of one side of the flexible substrate away from the rigid substrate and includes at least one bonding pad.

20 Claims, 6 Drawing Sheets

(51) Int. Cl.
*H10K 77/10* (2023.01)
*H10K 102/00* (2023.01)

(56) References Cited

U.S. PATENT DOCUMENTS

| | | | |
|---|---|---|---|
| 2017/0351475 | A1* | 12/2017 | Meersman ............... G09G 3/32 |
| 2018/0182840 | A1 | 6/2018 | Lin |
| 2020/0295120 | A1* | 9/2020 | Bower ................ H01L 25/0753 |

FOREIGN PATENT DOCUMENTS

| | | |
|---|---|---|
| CN | 106783920 A | 5/2017 |
| CN | 107316881 A | 11/2017 |
| CN | 108766979 A | 11/2018 |
| CN | 209149722 U | 7/2019 |
| CN | 110168627 A | 8/2019 |
| CN | 209265903 U | 8/2019 |
| CN | 110297346 A | 10/2019 |
| CN | 110379314 A | 10/2019 |
| CN | 209676596 U | 11/2019 |
| CN | 111261057 A | 6/2020 |
| JP | 2008191502 A | 8/2008 |

OTHER PUBLICATIONS

OLED Display Basic and Industry, published in Force et al., Electron and Technology University Press, Feb. 2015, pp. 71, 76-79.
First Office Action dated Mar. 2, 2021, for related CN Application No. 202010092736.1, with machine translation (18 pgs.).

* cited by examiner

DISPLAY PANEL AND DISPLAY DEVICE

CROSS-REFERENCE TO RELATED APPLICATIONS

This is a National Stage Application filed under 35 U.S.C. 371 based on International Patent Application No. PCT/CN2021/076023, filed on Feb. 8, 2021, which claims priority to Chinese Patent Application No. 202010092736.1 filed on Feb. 14, 2020, disclosures of both of which are is incorporated herein by reference in their entireties.

TECHNICAL FIELD

The present application relates to display techniques and, in particular, to a display panel and a display device.

BACKGROUND

With the further development of display technology, display panels and display devices composed of single display units have been widely used in public places such as stage, exhibition and so on.

In the related art, the display panels and the display devices formed by splicing single display units have the problem that a non-display region occupies a large proportion.

SUMMARY

The present application provides a display panel and a display device, which solves a problem in the related art that the display panel and the display device formed by splicing single display units have a large proportion of a non-display region.

In a first aspect, an embodiment of the present application provides a display panel. The display panel includes at least two display units, where each display unit includes a rigid substrate, a flexible substrate, a light-emitting unit circuit layer and at least one driver chip.

The rigid substrate includes a display bearing region and a splicing region located on at least one side of the display bearing region.

The flexible substrate is located on a first surface of the rigid substrate and located in the display bearing region, and the flexible substrate at least partially extends out of the display bearing region of the rigid substrate.

The light-emitting unit circuit layer is located on a surface of one side of the flexible substrate away from the rigid substrate and includes at least one bonding pad.

The at least one driver chip is located on a surface of one side, away from the light-emitting unit circuit layer, of the flexible substrate at least partially extending out of the display bearing region of the rigid substrate or located in the splicing region, and is electrically connected to the at least one bonding pad through a conductive connection layer located on a side surface of the flexible substrate.

Optionally, the rigid substrate includes a first splicing region located on a first side of the display bearing region, and the flexible substrate at least partially extends out of a second side of the display bearing region of the rigid substrate disposed opposite to the first side.

Optionally, the rigid substrate includes a second splicing region located on the second side of the display bearing region and a third splicing region located on a third side of the display bearing region, and an extension direction of the second splicing region is perpendicular to an extension direction of the third splicing region.

The flexible substrate at least partially extends out of at least one of a fourth side of the display bearing region of the rigid substrate disposed opposite to the second side or a fifth side of the display bearing region of the rigid substrate disposed opposite to the third side.

Optionally, the display panel further includes at least one first groove, where the at least one first groove is located on a surface of a side, away from the light-emitting unit circuit layer, of the flexible substrate at least partially extending out of the display bearing region of the rigid substrate.

The at least one driver chip is located in the at least one first groove, is flush with the surface of one side, away from the light-emitting unit circuit layer, of the flexible substrate, and is electrically connected to the at least one bonding pad through the conductive connection layer located on a side surface of the flexible substrate.

Optionally, the display panel further includes at least one second groove, where the at least one second groove is located on a first surface of the splicing region, the at least one driver chip is located in the at least one second groove, is flush with the first surface of the splicing region or a second surface of the splicing region and is electrically connected to the at least one bonding pad through a conductive connection layer located a side surface of the flexible substrate, the first surface is disposed opposite to the second surface, and the first surface of the splicing region is the first surface of the rigid substrate.

The display panel further includes at least one conductive through hole, where the at least one conductive through hole is located in the splicing region, the at least one driver chip is located on a second surface of the splicing region, and the conductive connection layer extends to a first surface of the splicing region and is electrically connected to the at least one driver chip through the at least one conductive through hole.

Optionally, the conductive connection layer includes at least one conductive film layer.

Optionally, the light-emitting unit circuit layer further includes a metal line layer, the metal line layer includes a plurality of data lines, a plurality of scanning lines and a plurality of light-emitting units each of which is determined by intersecting a data line and a scanning line, a first electrode of a light-emitting unit is electrically connected to a data line, and a second electrode of the light-emitting unit is electrically connected to a scanning line.

The plurality of data lines and the plurality of scanning lines are electrically connected to the at least one bonding pad, separately.

Optionally, the metal line layer further includes a signal input line layer and a light-emitting driver line layer, the signal input line layer is electrically connected to the plurality of data lines and the plurality of scanning lines, separately and the signal input line layer is used for providing a drive power signal to the light-emitting driver line layer, and the light-emitting driver line layer is used for driving the light-emitting unit to emit light.

Optionally, the rigid substrate includes glass.

Optionally, the flexible substrate includes polyimide (PI) or Polyethylene Naphthalate (PEN), and a thickness of the flexible substrate is greater than or equal to 5 μm and less than or equal to 50 μm.

In a second aspect, a display device provided by the embodiment of the present disclosure includes the display panel described in any one of the first aspect.

In technical solutions in present embodiments, the light-emitting unit circuit layer is located on a surface of one side of the flexible substrate away from the rigid substrate. The bonding pad of the light-emitting unit circuit layer is electrically connected to the driver chip through the conductive connection layer located on the side surface of the flexible substrate. The driver chip is located on the surface of a side of the flexible substrate, where the flexible substrate extends out of the display bearing region of the rigid substrate and the side of flexible substrate is away from the light-emitting unit circuit layer, or the driver chip located in the splicing region The driver chip is located on the surface of one side, away from the light-emitting unit circuit layer, of the flexible substrate extending out of the display bearing region of the rigid substrate or located in the splicing region, and without occupying a partial region of the flexible substrate for display. The adjacent two display units can be spliced in the following manner: one of the adjacent two display units and a part of the flexible substrate extending out of the rigid substrate are placed in the splicing region of the previous display unit. Splicing gaps between display units are eliminated, in a process of implementing a display panel of large size, the following technical affected are implemented:

1. the region ratio between the display region spliced by the plurality of display units and the entire display panel is increased;
2. the production cost is reduced.

DETAILED DESCRIPTION

Figure 1:
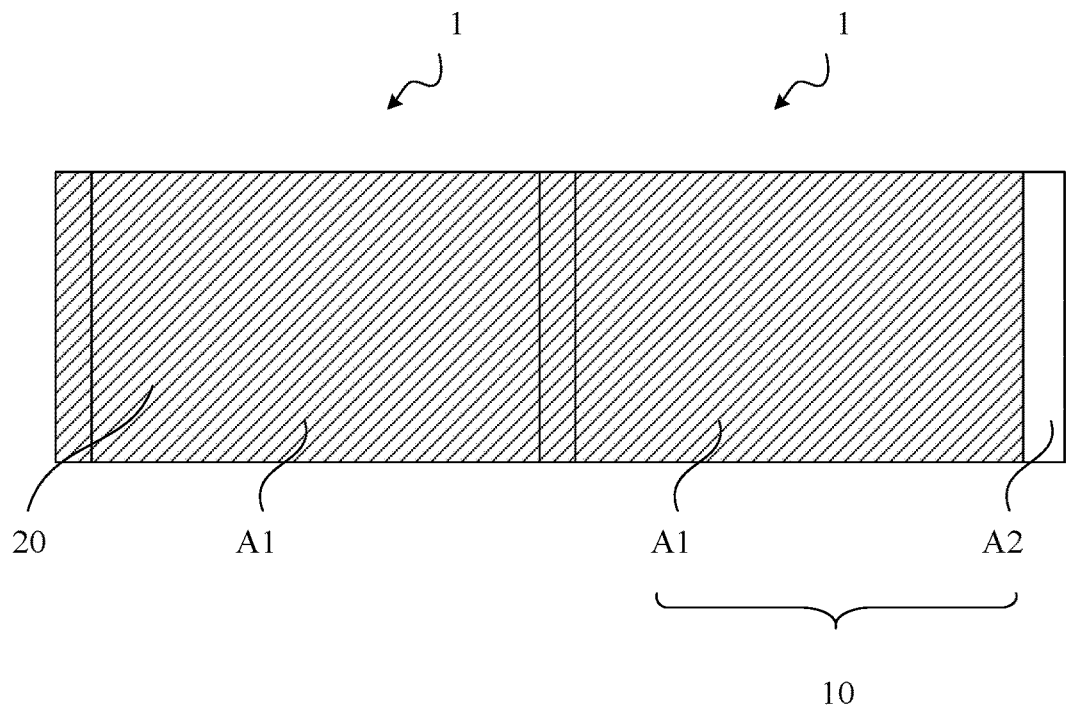
FIG. 1 is a structural diagram of a display panel according to an embodiment of the present application.

The present application is further described in detail hereinafter in conjunction with the drawings and embodiments. It is to be understood that the embodiments described herein are intended to illustrate and not to limit the present application. Additionally, it is to be noted that to facilitate description, only part, not all, of structures related to the present application are illustrated in the drawings.

Figure 2:
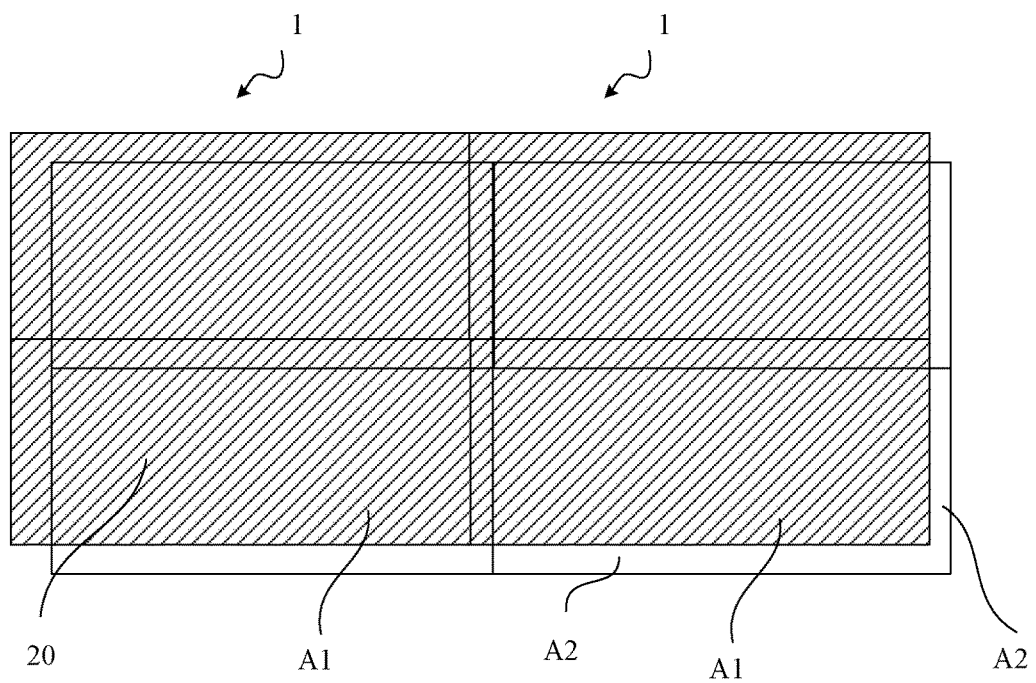
FIG. 2 is a structural diagram of anther display panel according to an embodiment of the present application.

The embodiment of the present application provides a display panel. As shown in FIGS. 1 and 2, the display panel is formed by a plurality of display units 1 i.e. at least two display units 1. Each display unit 1 includes a substrate 10, a flexible substrate 20, a light-emitting unit circuit layer and at least one driver chip. The rigid substrate 10 includes a display bearing region A1 and a splicing region A2 located on at least one side of the display bearing region A1. The flexible substrate 20 is located on a first surface of the rigid substrate 10 and located in the display bearing region, and the flexible substrate 20 at least partially extends out of the display bearing region A1 of the rigid substrate 10. The light-emitting unit circuit layer is located on a surface of one side of the flexible substrate away from the rigid substrate and includes at least one bonding pad. The at least one driver chip is located on a surface of one side, away from the light-emitting unit circuit layer, of the flexible substrate extending out of the display bearing region of the rigid substrate or located in the splicing region, and is electrically connected to the at least one bonding pad through a conductive connection layer located on a side surface of the flexible substrate.

It is to be noted that FIG. 1 schematically illustrates two display units 1, and the rigid substrate 10 includes a display bearing region A1 and the splicing region A2 located on one side of the display bearing region A1. FIG. 2 schematically illustrates four display units 1, and the rigid substrate 10 includes the display bearing region A1 and the splicing regions A2 located on two sides of the display bearing region A1.

In this embodiment, the light-emitting unit circuit layer is located on a surface of one side of the flexible substrate away from the rigid substrate. The bonding pad of the light-emitting unit circuit layer is electrically connected to the driver chip located on the surface of one side, away from the light-emitting unit circuit layer, of the flexible substrate extending out of the display bearing region of the rigid substrate or the driver chip located in the splicing region through the conductive connection layer located on the side surface of the flexible substrate. The driver chip is located on the surface of one side, away from the light-emitting unit circuit layer, of the flexible substrate extending out of the display bearing region of the rigid substrate or located in the splicing region, and without occupying a partial region of the flexible substrate 20 for display.

In this embodiment, the flexible substrate 20 is exemplarily polyimide (PI), which is one of the organic polymer materials of best synthetic performance. Optionally, a color of the PI may be yellow. The flexible substrate 20 may also be exemplarily polyethylene naphthalate-2,6-dicarboxylate (PEN). The PEN has high physical and mechanical properties, gas barrier properties, chemical stability and heat-resistance, ultraviolet-resistance, radiation resistance, etc., and is an emerging good polymer.

In this embodiment, the adjacent two display units 1 can be spliced in the following manner. Referring to FIGS. 1 and 2, one of the adjacent two display units 1 extends out a part of the flexible substrate 20 of the rigid substrate 10 and is placed in the splicing region A2 of the previous display unit 1.

In the related art, the display panel and the driver chip of the light-emitting unit circuit layer are often disposed on the rigid substrate to occupy an area of the display screen, resulting in a smaller area ratio between the display region of a single display unit and the rigid substrate of the entire display unit, and thus the plurality of display units are spliced to have splicing gaps occupied by the driver circuit during the splicing process, further resulting in a smaller area ratio between the display region spliced by the plurality of display units and the entire display panel.

In technical solutions in present embodiments, the light-emitting unit circuit layer is located on a surface of one side of the flexible substrate away from the rigid substrate. The bonding pad of the light-emitting unit circuit layer is electrically connected to the driver chip located on the surface of one side, away from the light-emitting unit circuit layer, of the flexible substrate extending out of the display bearing region of the rigid substrate or the driver chip located in the splicing region through the conductive connection layer located on the side surface of the flexible substrate. The driver chip is located on the surface of one side, away from the light-emitting unit circuit layer, of the flexible substrate extending out of the display bearing region of the rigid substrate or located in the splicing region, and without occupying a partial region of the flexible substrate 20 for display. The adjacent two display units 1 can be spliced in the following manner. Referring to FIGS. 1 and 2, one of the adjacent two display units 1 extends out a part of the flexible substrate 20 of the rigid substrate 10 and is placed in the splicing region A2 of the previous display unit 1. Splicing gaps between display units 1 are eliminated, resulting in an increased region ratio between the display region spliced by the plurality of display units 1 and the entire display panel in a process of implementing a display panel of large size, and reducing production costs.

Figure 3:
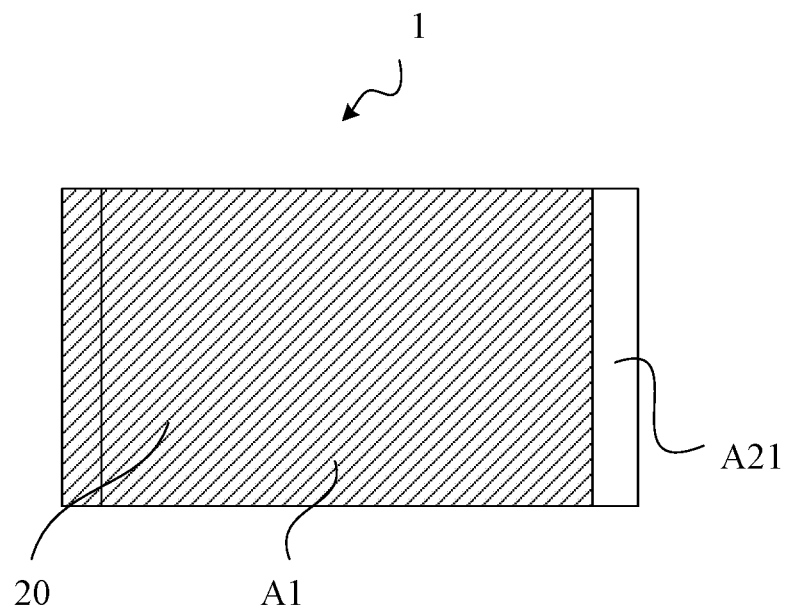
FIG. 3 is a structural diagram of a display unit according to an embodiment of the present application.

Optionally, on the basis of the above technical solutions, referring to FIG. 3, the rigid substrate includes a first splicing region A21 located on a first side of the display bearing region A2, and the flexible substrate 20 at least partially extends out of a second side of the display bearing region A1 of the rigid substrate disposed opposite to the first side. The adjacent two display units 1 can be spliced in the following manner: one of the adjacent two display units 1 extends out a part of the flexible substrate 20 of the rigid substrate 10 and is placed in the first splicing region A21 of the previous display unit 1.

Figure 4:
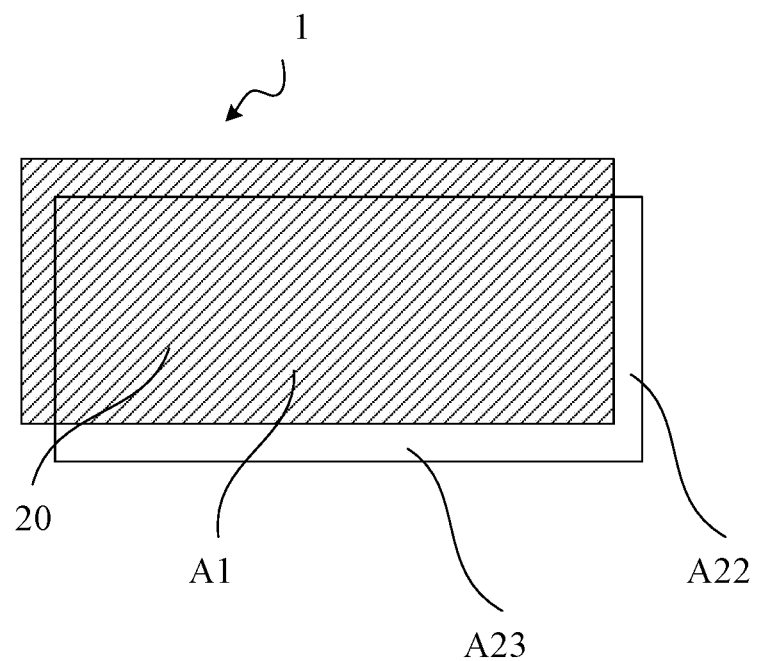
FIG. 4 is a structural diagram of another display unit according to an embodiment of the present application.

Optionally, on the basis of the above technical solutions, referring to FIG. 4, the rigid substrate 10 includes a second splicing region A22 located on a second side of the display bearing region A1 and a third splicing region A23 located on a third side of the display bearing region A1, and an extension direction of the second splicing region A22 is perpendicular to an extension direction of the third splicing region A23. The flexible substrate 20 at least partially extends out of at least one of a fourth side of the display bearing region A1 of the rigid substrate 10 disposed opposite to the second side or a fifth side of the display bearing region A1 of the rigid substrate 10 disposed opposite to the third side. The adjacent two display units 1 can be spliced in the following manner: one of the adjacent two display units 1 extends out a part of the flexible substrate 20 of the rigid substrate 10 and is placed in the second splicing region A22 of the previous display unit 1 and the third splicing region A23 of the previous display unit 1.

Figure 5:
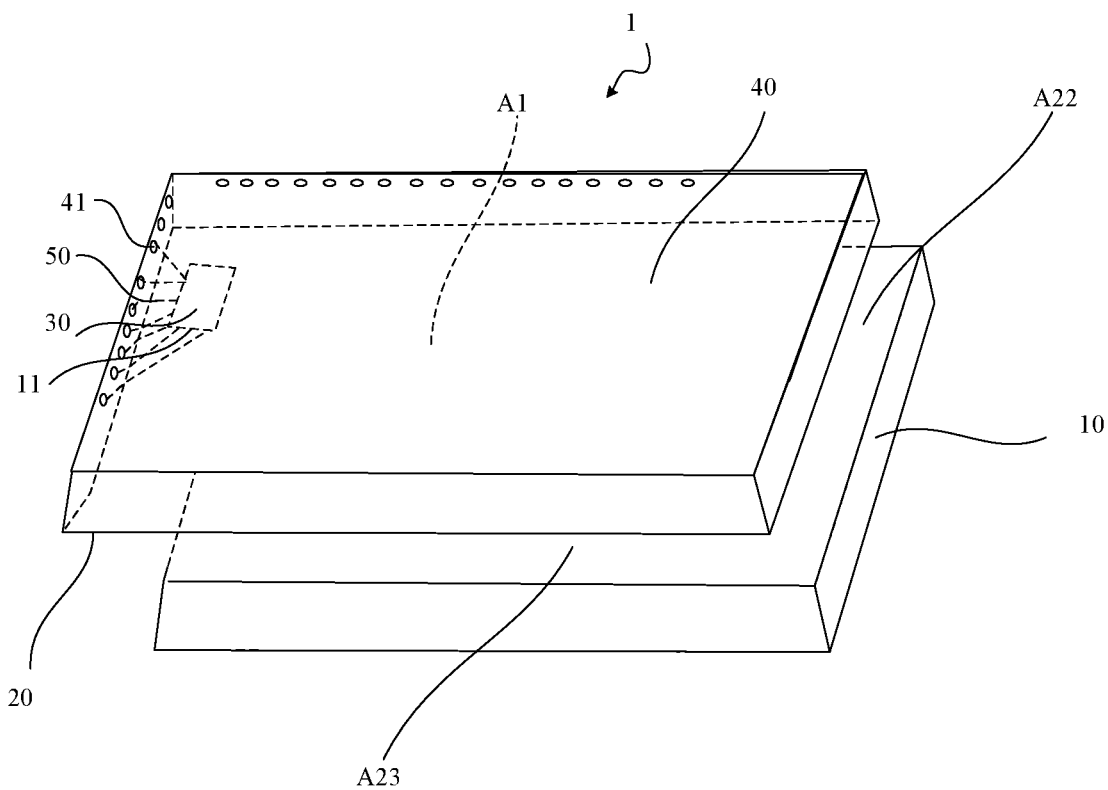
FIG. 5 is a structural diagram of another display unit according to an embodiment of the present application.

Optionally, on the basis of the above technical solutions, the display unit shown in FIG. 4 is described as an example. Referring to FIG. 5, the display panel further at least one first groove 11. The at least one first groove 11 is located on a surface of one side of the flexible substrate 20, where the side of the flexible substrate 20 is away from the light-emitting unit circuit layer 40 and the flexible substrate 20 extends out of the display bearing region A1 of the rigid substrate 10. The at least one driver chip 30 is located in the at least one first groove 11. The at least one driver chip 30 is flush with the surface of one side of the flexible substrate 20 and the side of the flexible substrate 20 is away from the light-emitting unit circuit layer 40. The at least one driver chip 30 is electrically connected to the at least one bonding pad 41 through the conductive connection layer 50 located on a side surface of the flexible substrate 20. The light-emitting unit circuit layer is located on a surface of one side of the flexible substrate away from the rigid substrate. The bonding pad 41 of the light-emitting unit circuit layer 40 is electrically connected to the driver chip located on the surface of one side, away from the light-emitting unit circuit layer 40, of the flexible substrate 20 extending out of the display bearing region A1 of the rigid substrate 10 through the conductive connection layer 50 located on the side surface of the flexible substrate 20. The driver chip 30 is located on the surface of one side, away from the light-emitting unit circuit layer 40, of the flexible substrate 20 extending out of the display bearing region A1 of the rigid substrate 10 and without occupying a partial region of the flexible substrate 20 for display.

Figure 6:
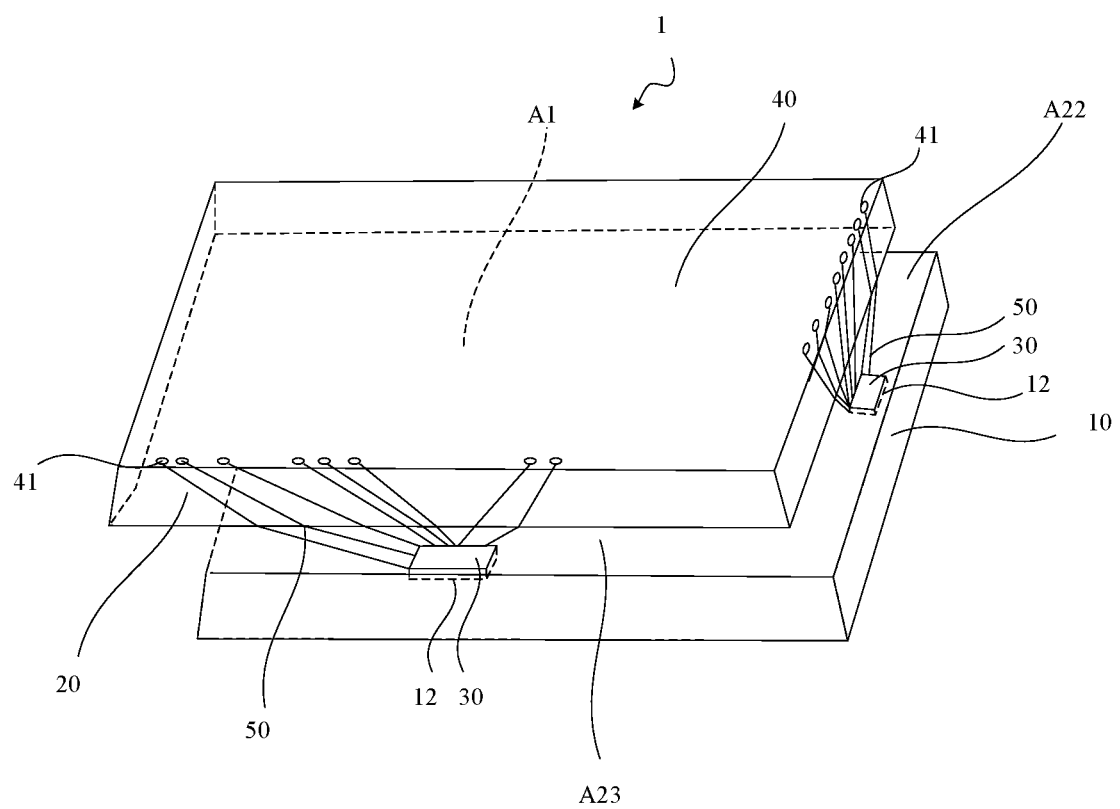
FIG. 6 is a structural diagram of another display unit according to an embodiment of the present application.

Optionally, on the basis of the above technical solutions, the display unit shown in FIG. 4 is described as an example. Referring to FIG. 6, the display panel further includes at least one second groove 12, where the at least one second groove 12 is located on a first surface of the second splicing region A22 and a first surface of the third splicing region A23 in the splicing region, the at least one driver chip 30 is located in the at least one second groove 12, is flush with the first surface or the second surface of the second splicing region A22 and the first surface or the second surface of the third splicing region A23 in the splicing region and is electrically connected to the at least one bonding pad 41 through the conductive connection layer 50 located a side surface of the flexible substrate 20. The first surface is disposed opposite to the second surface, and the first surface of the second splicing region A22 is the first surface of the rigid substrate 10. The light-emitting unit circuit layer 40 is located on a surface of one side of the flexible substrate away from the rigid substrate, and the at least one bonding pad 41 of the light-emitting unit circuit layer 40 is electrically connected to the at least one driver chip 30 in the at least one second groove 12 located in the second splicing region A22 and the third splicing region A23 in the splicing region. The at least one driver chips 30 is located in the at least one second groove 12 of the second splicing region A22 and the third splicing region A23 in the splicing region and without occupying a partial region of the flexible substrate 20 for display.

Figure 7:
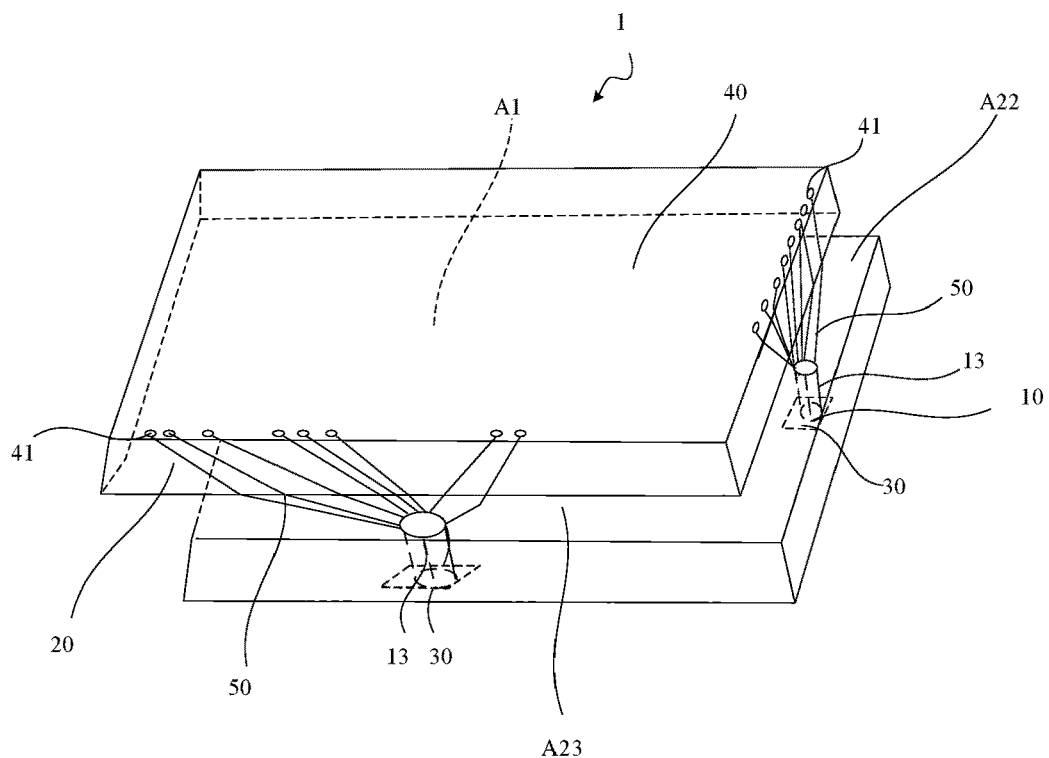
FIG. 7 is a structural diagram of another display unit according to an embodiment of the present application.

Optionally, on the basis of the above technical solutions, the display unit shown in FIG. 4 is described as an example. Referring to FIG. 7, the display panel further includes at least one conductive through hole 13, where the at least one conductive through hole 13 is located in the second splicing region A22 and the third splicing region A23 in the splicing region, the at least one driver chip 30 is located on a second surface of the second splicing region A22 and a second surface of the third splicing region A23 in the splicing region, and the conductive connection layer 50 extends to a first surface of the second splicing region A22 and a first surface of the third splicing region A23 in splicing region and is electrically connected to the at least one driver chip 30 through the at least one conductive through hole 13. The light-emitting unit circuit layer is located on a surface of one side of the flexible substrate away from the rigid substrate, and at least one bonding pad 41 and the at least one conductive through hole 13 are electrically connected to the at least one driver chip 30 located on the second surface of the second splicing region A22 and the second surface of the third splicing region A23 in the splicing region. The at least one driver chips 30 is located on the second surface of the second splicing region A22 and the second surface of the third splicing region A23 in the splicing region and without occupying a partial region of the flexible substrate 20 for display.

Optionally, on the basis of the above technical solutions, the conductive connection layer 50 includes one or a plurality of conductive film layers. The conductive connection layer 50 is prepared by selecting conductive solution such as conductive ink including nanoparticles of Ag, Au, Cu, Al and the like, or a conductive paste in which nanoparticles of Ag, Cu, Au, Al, are polymerized with a polymer, and using a solution processing method such as an ink-jet printing method, a spraying method and a screen printing method, using the bonding pad 41 and the connection bonding pad of the driver chip 30 as target connection points, preparing the conductive solution, and obtaining the conductive connection layer 50 after the conductive solution is solidified. The solution processing method in this embodiment is not limited to the ink-jet printing method, spraying method, and the screen printing method. The conductive solution in this embodiment is not limited to the conductive ink including the nanoparticles such as Ag, Au, Cu, Al, or the conductive paste in which the nanoparticles such as Ag, Cu, Au, Al are polymerized with the polymer.

In this embodiment, the at least one bonding pad 41 is electrically connected to the connection bonding pad of the at least one driver chip 30 through the conductive connection layer 50 prepared by the solution processing method using the conductive solution, and the splicing gap between the adjacent display units 1 does not occur during the splicing process of the plurality of display units 1, and in the process of achieving a large-size display panel, the area ratio between the display region spliced by the plurality of display units and the entire display panel is increased and the production cost is reduced. A thickness of the conductive connection layer 50 may be 20 nm-2000 nm.

Figure 8:
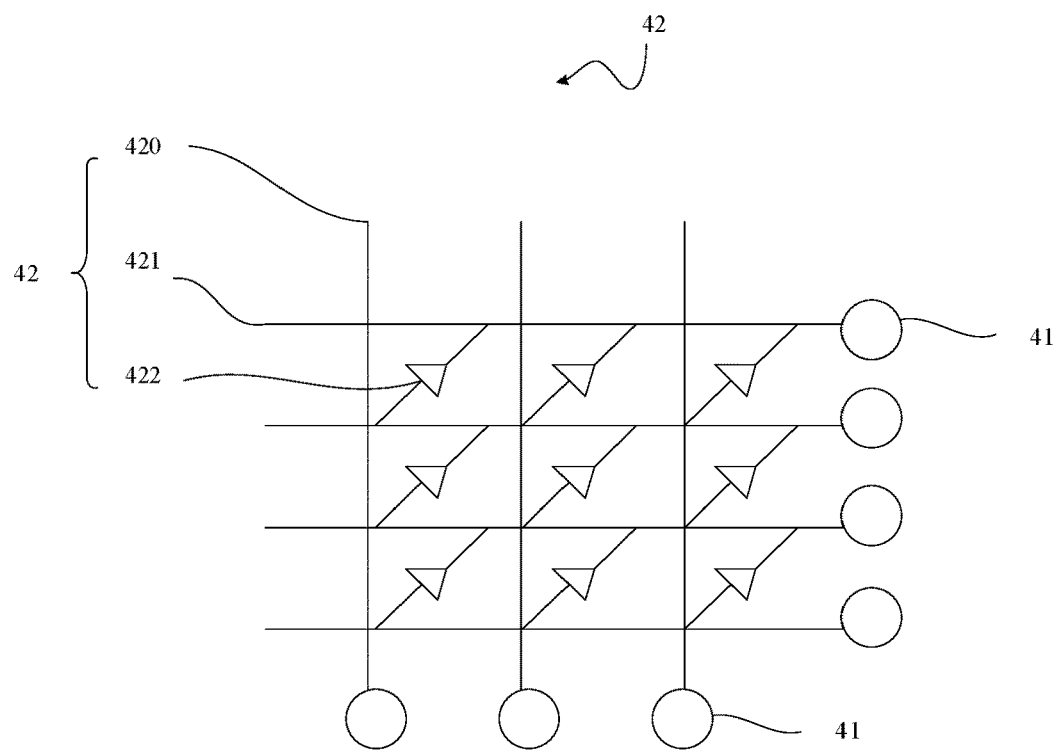
FIG. 8 is a structural diagram of a light-emitting unit circuit layer according to an embodiment of the present application.

Optionally, on the basis of the above technical solutions, referring to FIG. 8, the light-emitting unit circuit layer 40 further includes a metal line layer 42, the metal line layer 42 includes a plurality of data lines 420, a plurality of scanning lines 421 and a plurality of light-emitting unit 422 each of which is determined by intersecting a data line 420 and a scanning line 421, a first electrode of the light-emitting unit 422 is electrically connected to the data line 420, and a second electrode of the light-emitting unit 422 is electrically connected to the scanning line 421. The data line 420 and the scanning line 421 are electrically connected to the bonding pad 41, separately. This drive scheme is referred to as a passive matrix (PM) drive scheme.

Figure 9:
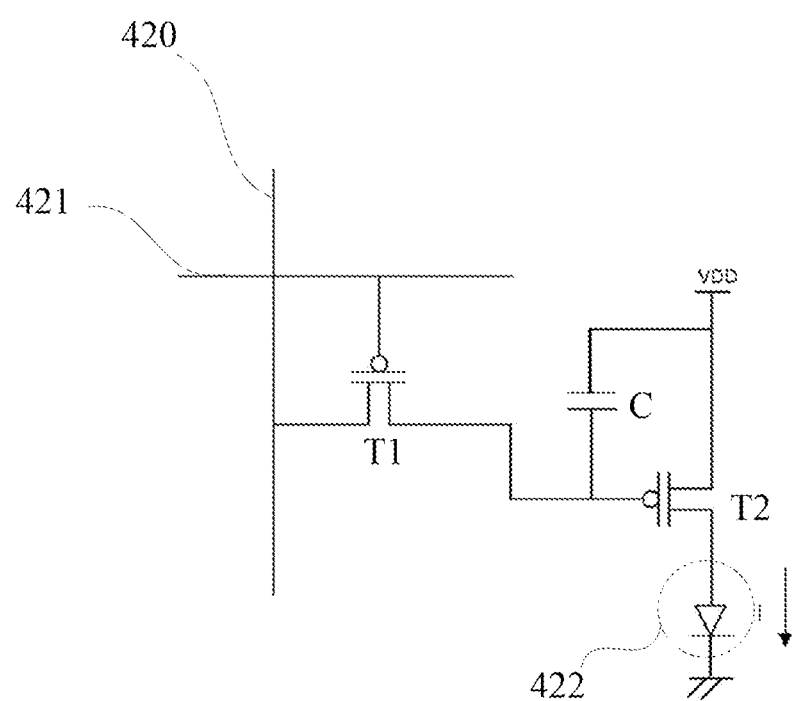
FIG. 9 is a structural diagram of another light-emitting unit circuit layer according to an embodiment of the present application.

Optionally, on the basis of the above technical solutions, the metal line layer 42 further includes a signal input line layer and a light-emitting driver line layer, the signal input line layer is electrically connected to the plurality of data lines 420 and the plurality of scanning lines 421 separately and is used for providing a drive power signal to the light-emitting driver line layer, and the light-emitting driver line layer is used for driving the light-emitting unit to emit light. Exemplarily, referring to FIG. 9, the signal input line layer includes a first thin film transistor T1 and a capacitor C, and the light-emitting driver line layer includes a second thin film transistor T2. The first thin film transistor T1 and the second thin film transistor T2 are a P-type thin film transistor. This drive scheme is referred to as an active matrix (AM) drive scheme.

Optionally, the thin film transistors T1 and T2 may be one or more of metal oxide semiconductor thin film transistors, amorphous silicon semiconductor thin film transistors, or low temperature oxide thin film transistors. Optionally, when the flexible substrate 20 is placed on a carrier, a thin film transistor array is manufactured, the bonding pads 41 of the drive wires are reserved in the display region, and then the light-emitting units 422 are manufactured. The flexible substrate 20 is then removed from the carrier, aligned, and placed on the rigid substrate 10. The silver paste is then printed onto the display bearing region A1 of the rigid substrate 10 by ink-jet printing method using the silver paste, and is electrically connected to the at least one driver chip 30 through the conductive connection layer 50.

Optionally, on the basis of the above technical solutions, the thickness of the flexible substrate 20 is greater than or equal to 5 μm and less than or equal to 50 μm. The flexible substrate 20 of which the thickness is less than 5 μm is not sufficient to support the light-emitting unit circuit layer 40, and the thickness of the flexible substrate 20 is greater than 50 μm, resulting in an entire display panel that is too heavy. The supplier may be a product provided by UBE Corporation, KANEKA Corporation, Konica Corporation, or the like.

Optionally, on the basis of the above technical solutions, the light-emitting unit 422 includes an organic light-emitting diode or an inorganic light-emitting diode, where the inorganic light-emitting diode includes at least one of a micro light-emitting diode or a mini light-emitting diode. The micro light-emitting diode or the mini light-emitting diode have a smaller size, may reduce the pixel pitch from millimeter to micrometer and have the advantages of self-luminous, high brightness, low power consumption, wide color gamut, etc., so that the display panel can display good images while reducing production cost.

Optionally, on the basis of the above technical solutions, the rigid substrate includes glass. Optionally, on the basis of the above technical solutions, the rigid substrate 10 includes glass. In this embodiment, the thickness of the glass may be 0.3-5 mm.

An embodiment of the present application further provides a display device. Since the display device provided by this embodiment adopts the preceding display panel, the display device has the same beneficial effects as the preceding display panel.

What is claimed is:

1. A display panel comprising: at least two display units, wherein each of the at least two display units comprises a rigid substrate, and the rigid substrate comprises a display bearing region and a splicing region located on at least one side of the display bearing region;
a flexible substrate, wherein the flexible substrate is located on a first surface of the rigid substrate and located in the display bearing region, and the flexible substrate at least partially extends out of the display bearing region of the rigid substrate;
a light-emitting unit circuit layer, wherein the light-emitting unit circuit layer is located on a surface of one side of the flexible substrate away from the rigid substrate and comprises at least one bonding pad; and
at least one driver chip, wherein the at least one driver chip is located on a surface of a side, away from the light-emitting unit circuit layer, of the flexible substrate at least partially extending out of the display bearing region of the rigid substrate or the at least one driver chip is located in the splicing region, and the at least one driver chip is electrically connected to the at least one bonding pad through a conductive connection layer located on a side surface of the flexible substrate.

2. The display panel of claim 1, wherein
the rigid substrate comprises a first splicing region located on a first side of the display bearing region, and the flexible substrate at least partially extends out of a second side of the display bearing region of the rigid substrate disposed opposite to the first side.

3. The display panel of claim 2, wherein
the rigid substrate comprises a second splicing region located on the second side of the display bearing region and a third splicing region located on a third side of the display bearing region, and an extension direction of the second splicing region is perpendicular to an extension direction of the third splicing region; and
the flexible substrate at least partially extends out of at least one of a fourth side of the display bearing region of the rigid substrate disposed opposite to the second side or a fifth side of the display bearing region of the rigid substrate disposed opposite to the third side.

4. The display panel of claim 1, further comprising:
at least one first groove, wherein the at least one first groove is located on a surface of a side, away from the light-emitting unit circuit layer, of the flexible substrate extending out of the display bearing region of the rigid substrate, and
wherein the at least one driver chip is located in the at least one first groove, the at least one driver chip is flush with the surface of a side, away from the light-emitting unit circuit layer, of the flexible substrate, and the at least one driver chip is electrically connected to the at least one bonding pad through the conductive connection layer located on a side surface of the flexible substrate.

5. The display panel of claim 1, further comprising:
at least one second groove, wherein the at least one second groove is located on a first surface of the splicing region, the at least one driver chip is located in the at least one second groove, the at least one driver chip is flush with the first surface of the splicing region or a second surface of the splicing region and the at least one driver chip is electrically connected to the at least one bonding pad through the conductive connection layer located a side surface of the flexible substrate, the first surface is disposed opposite to the second surface, and the first surface of the splicing region is the first surface of the rigid substrate; or
at least one conductive through hole, wherein the at least one conductive through hole is located in the splicing region, the at least one driver chip is located on a second surface of the splicing region, and the conductive connection layer extends to a first surface of the splicing region and is electrically connected to the at least one driver chip through the at least one conductive through hole.

6. The display panel of claim 1, wherein
the conductive connection layer comprises at least one conductive film layer.

7. The display panel of claim 1, wherein
the light-emitting unit circuit layer further comprises a metal line layer, the metal line layer comprises a plurality of data lines, a plurality of scanning lines and a plurality of light-emitting units each of which is determined by intersecting a data line of the plurality of data lines and a scanning line of the plurality of scanning lines, a first electrode of a light-emitting unit of the plurality of light-emitting units is electrically connected to a data line of the plurality of data lines, and a second electrode of the light-emitting unit is electrically connected to a scanning line; and
the plurality of data lines and the plurality of scanning lines are electrically connected to the at least one bonding pad, separately.

8. The display panel of claim 7, wherein
the metal line layer further comprises a signal input line layer and a light-emitting driver line layer, the signal input line layer is electrically connected to the plurality of data lines and the plurality of scanning lines, separately, and the signal input line layer is used for providing a drive power signal to the light-emitting driver line layer, and the light-emitting driver line layer is used for driving the light-emitting unit to emit light.

9. The display panel of claim 1, wherein
the rigid substrate comprises glass.

10. The display panel of claim 1, wherein
the flexible substrate comprises polyimide or polyethylene naphthalate-2,6-dicarboxylate, and a thickness of the flexible substrate is greater than or equal to 5 microns and less than or equal to 50 microns.

11. A display device, comprising a display panel, wherein the display panel comprises:
at least two display units, wherein each of the at least two display units comprises a rigid substrate, and the rigid substrate comprises a display bearing region and a splicing region located on at least one side of the display bearing region;
a flexible substrate, wherein the flexible substrate is located on a first surface of the rigid substrate and located in the display bearing region, and the flexible substrate at least partially extends out of the display bearing region of the rigid substrate;
a light-emitting unit circuit layer, wherein the light-emitting unit circuit layer is located on a surface of one side of the flexible substrate away from the rigid substrate and comprises at least one bonding pad; and
at least one driver chip, wherein the at least one driver chip is located on a surface of a side, away from the light-emitting unit circuit layer, of the flexible substrate at least partially extending out of the display bearing region of the rigid substrate or the at least one driver chip is located in the splicing region, and the at least one driver chip is electrically connected to the at least one bonding pad through a conductive connection layer located on a side surface of the flexible substrate.

12. The display device of claim 11, wherein
the rigid substrate comprises a first splicing region located on a first side of the display bearing region, and the flexible substrate at least partially extends out of a second side of the display bearing region of the rigid substrate disposed opposite to the first side.

13. The display device of claim 12, wherein
the rigid substrate comprises a second splicing region located on the second side of the display bearing region and a third splicing region located on a third side of the display bearing region, and an extension direction of the second splicing region is perpendicular to an extension direction of the third splicing region; and
the flexible substrate at least partially extends out of at least one of a fourth side of the display bearing region of the rigid substrate disposed opposite to the second side or a fifth side of the display bearing region of the rigid substrate disposed opposite to the third side.

14. The display device of claim 11, further comprising:
at least one first groove, wherein the at least one first groove is located on a surface of a side, away from the light-emitting unit circuit layer, of the flexible substrate extending out of the display bearing region of the rigid substrate, and
wherein the at least one driver chip is located in the at least one first groove, the at least one driver chip is flush with the surface of a side, away from the light-emitting unit circuit layer, of the flexible substrate, and the at least one driver chip is electrically connected to the at least one bonding pad through the conductive connection layer located on a side surface of the flexible substrate.

15. The display device of claim 11, further comprising:
at least one second groove, wherein the at least one second groove is located on a first surface of the splicing region, the at least one driver chip is located in the at least one second groove, the at least one driver chip is flush with the first surface of the splicing region or a second surface of the splicing region and the at least one driver chip is electrically connected to the at least one bonding pad through the conductive connection layer located a side surface of the flexible substrate, the first surface is disposed opposite to the second surface, and the first surface of the splicing region is the first surface of the rigid substrate; or
at least one conductive through hole, wherein the at least one conductive through hole is located in the splicing region, the at least one driver chip is located on a second surface of the splicing region, and the conductive connection layer extends to a first surface of the splicing region and is electrically connected to the at least one driver chip through the at least one conductive through hole.

16. The display device of claim 11, wherein
the conductive connection layer comprises at least one conductive film layer.

17. The display device of claim 11, wherein
the light-emitting unit circuit layer further comprises a metal line layer, the metal line layer comprises a plurality of data lines, a plurality of scanning lines and a plurality of light-emitting units each of which is determined by intersecting a data line of the plurality of data lines and a scanning line of the plurality of scanning lines, a first electrode of a light-emitting unit of the plurality of light-emitting units is electrically connected to a data line of the plurality of data lines, and a second electrode of the light-emitting unit is electrically connected to a scanning line; and
the plurality of data lines and the plurality of scanning lines are electrically connected to the at least one bonding pad, separately.

18. The display device of claim 17, wherein
the metal line layer further comprises a signal input line layer and a light-emitting driver line layer, the signal input line layer is electrically connected to the plurality of data lines and the plurality of scanning lines, separately, and the signal input line layer is used for providing a drive power signal to the light-emitting driver line layer, and the light-emitting driver line layer is used for driving the light-emitting unit to emit light.

19. The display device of claim 11, wherein
the rigid substrate comprises glass.

20. The display device of claim 11, wherein
the flexible substrate comprises polyimide or polyethylene naphthalate-2,6-dicarboxylate, and a thickness of the flexible substrate is greater than or equal to 5 microns and less than or equal to 50 microns.

* * * * *